United States Patent [19]
Thomas et al.

[11] Patent Number: 5,978,226
[45] Date of Patent: Nov. 2, 1999

[54] ELECTRICAL DEVICE HAVING COMPONENT HEAT DISSIPATION

[75] Inventors: Gerhard Thomas, Edelweissweg; Karl Wutz, Missweg; Ehrenfried Fabry, Hersbruck, all of Germany

[73] Assignee: Robert Bosch GmbH, Stuttgart, Germany

[21] Appl. No.: 09/143,231

[22] Filed: Aug. 28, 1998

[30]       Foreign Application Priority Data

Sep. 11, 1997 [DE] Germany .......................... 297 16 303

[51] Int. Cl.⁶ ..................................... H05K 7/20
[52] U.S. Cl. .................. 361/707; 361/715; 361/730; 361/752
[58] Field of Search .................... 361/600, 679, 361/704, 707, 715, 719–721, 728, 730, 732, 736, 752, 756, 759, 785; 439/74, 79, 485, 487

[56]             References Cited

U.S. PATENT DOCUMENTS

| 4,723,196 | 2/1988 | Hofmeister et al. | 361/399 |
|---|---|---|---|
| 5,521,785 | 5/1996 | Schmidt et al. | 361/720 |
| 5,657,203 | 8/1997 | Hirao et al. | 361/707 |
| 5,671,122 | 9/1997 | Schoettl et al. | 361/715 |
| 5,808,868 | 9/1998 | Drekmeier | 361/704 |

*Primary Examiner*—Gregory Thompson
*Attorney, Agent, or Firm*—Kenyon & Kenyon

[57]            ABSTRACT

An electrical device with component heat dissipation, particularly a switching and control device for motor vehicles, includes a circuit board arranged in a package. The circuit board is equipped with electrical components, whose heat energy can be dissipated onto the circuit board, and a plug-in connector which has a connecting part connected with the circuit board and a plug-in connector base arranged adjacent to a circuit board surface. The circuit board rests on heat-conductive support surfaces formed inside on the package, and the device has a wedge whose bottom wedge side surface rests against the circuit board surface and whose opposite side engages with a bearing surface on the package in order to press the circuit board against the support surfaces.

13 Claims, 2 Drawing Sheets

ELECTRICAL DEVICE HAVING COMPONENT HEAT DISSIPATION

FIELD OF THE INVENTION

The present invention relates to an electrical device, for example a switching and control device for motor vehicles.

BACKGROUND INFORMATION

Known switching and control devices have power components arranged on a circuit board, for example for switching high currents, and these must be cooled because of the great amount of heat developed. For this purpose, a heat emission surface of the power component is connected with thermal conductivity to the circuit board, which acts as a cooling element. In this manner, the circuit board absorbs part of the heat energy of the components, and thereby increases the heat emission surface of the components, so that the heat energy can be emitted to the ambient air. Because of the increasing miniaturization of power components, for example using SMD technology, and the related high component density on the circuit board, circuit board cooling is often not effective enough.

It is an object of the present invention to further develop a device of the type stated initially, in such a way that the power components which are arranged in the electrical device can be reliably cooled.

SUMMARY OF THE INVENTION

According to the present invention, the heat energy of the power components to be cooled is additionally dissipated on heat-conductive support surfaces for the circuit board inside a package. In this way, the surface available for heat emission is increased, so that in addition to the circuit board, at least the support surfaces, but particularly also the entire package, act as a cooling element. At least one wedge is particularly arranged between the plug-in connector and the circuit board, and presses the circuit board against the heat-conductive support surfaces of the package, so that reliable transfer of the heat energy of the circuit board to the heat-conductive support surfaces is guaranteed. According to the present invention, the wedge rests against the package and presses the circuit board against the heat-conductive support surfaces with one wedge side.

It is a particular advantage of the present invention that no separate cooling elements for the components and therefore no additional parts for the electrical device are required. Using the wedge, the circuit board is pressed against the heat-conductive support surfaces with its heat emission region, in simple and cost-effective manner. Dissipation of component heat from the circuit board to parts of the package is very effective, because of the close contact between the circuit board and the support surfaces. Therefore the present invention is also particularly well-suited for circuit boards densely packed with components, double-sided feed-through circuit boards, or multilayer circuit boards.

In a particularly advantageous further development of the present invention, the at least one wedge projects beyond the plug-in connector base in the direction parallel to the circuit board surface. The wedge is part of the plug-in strip and is particularly connected with the plug-in connector base. For example, the wedge is screwed onto the bottom of the plug-in connector base. In this connection, the end of the wedge which projects beyond the plug-in connector base rests against the support surface which lies above the circuit board, with a second wedge side surface which lies opposite the first wedge side surface contacting the surface board.

In another further development of the present invention, the circuit board, with the part of the plug-in connector which is soldered to it, and the wedge, can be inserted into the package from one face, along the support surfaces. The soldered-on part of the plug-in connector can be either a plug-in strip or a socket strip. Preferably, the wedge narrows conically to its projecting end, in a direction parallel to the slide-in direction. This causes the circuit board to be advantageously pressed against the support surfaces for the circuit board, which act as rails, and which are particularly arranged laterally on the package walls.

Preferably, two wedges are arranged at opposite border regions of the circuit board, particularly parallel to the slide-in direction of the circuit board. In this way, the two wedges support the circuit board in being pressed against the support surface arranged on the side wall, in each instance, by sliding on this surface during the slide-in movement of the circuit board into the slide-in package. In this connection, the conical part which slides on the support surface on the side wall of the package pushes between the support surface and the bearing surface on the package, which are arranged parallel to one another and can be formed in the side wall as a step. The maximum distance between the bearing surface on the package and the support surface essentially corresponds to the total of the circuit board thickness and the maximum height of the wedge in a direction perpendicular to the circuit board surface. In this connection, it must be taken into consideration that the conical part presses the circuit board firmly against the heat-conductive support surface on the side wall after insertion. The bearing surface on the package, along which the wedge slides during insertion, can be formed on the inside wall surface of the package wall which lies above a circuit board surface. If the package is structured to be flat in the region of the circuit board, the wedge can rest against the circuit board with its bottom wedge side surface and against the top package wall with its top wedge side surface.

In a particularly advantageous further development of the present invention, at least one wedge which is connected with two plug-in connectors arranged adjacent to one another and projects beyond the plug-in connector base, in each instance, is arranged parallel to the slide-in direction of the circuit board. The wedge is rigidly attached at both plug-in connector bases, and thereby acts as an additional reinforcement, so that the plug-in connector packages are thereby fixed in place in their relative position.

A second wedge can also be arranged on an opposite side of the plug-in connector bases, so that a base is formed, on which the plug-in connectors are attached. For this purpose, the two wedges can be connected with one another by cross-braces. This advantageously results in a particularly stable unit of the wedges and plug-in connectors. Two plug-in connectors which are arranged either one behind the other or next to one another can be fixed in place on the base, which is made up of two wedges and two cross-braces. Preferably, two plug-in connectors, which are arranged next to one another and with the backs facing one another, and which are connected with the same wedge, are soldered to different circuit boards, so that the two circuit boards are additionally attached to one another by the combination of plug-in connector and wedge.

Preferably, the components whose heat is to be dissipated are arranged on the circuit board in the vicinity of a wedge, particularly in the vicinity of a package wall. This makes it possible to emit the heat energy to the adjacent support surface of the circuit board and thereby to the support surface on the package wall, in a particularly advantageous manner. For this purpose, a heat emission surface of the components rests against the circuit board surface, feed-throughs below this to dissipate heat to a layer, particularly a heat-conductive intermediate layer, are provided in the circuit board, and the circuit board has a heat emission region which rests against the support surface.

Because of the special arrangement of the components, particularly in a type lying on a side surface, and because of the method of effect of the wedge, of maintaining the heat-conductive contact between the circuit board and the heat-conductive support surfaces on the package, particularly good cooling of power components is produced. Therefore the present invention can advantageously be used in connection with SMD power components on double-sided feed-through or multilayer circuit boards in a slide-in package. The present invention makes it possible to accentuate the known circuit board cooling method and improve cooling by dissipating excess component waste heat from the circuit board to the support surfaces. Particularly in connection with slide-in housings, this results in particularly effective cooling without many additional parts being required.

DETAILED DESCRIPTION

The drawings show two exemplary embodiments of the present invention, which are explained in greater detail below.

Figure 1:
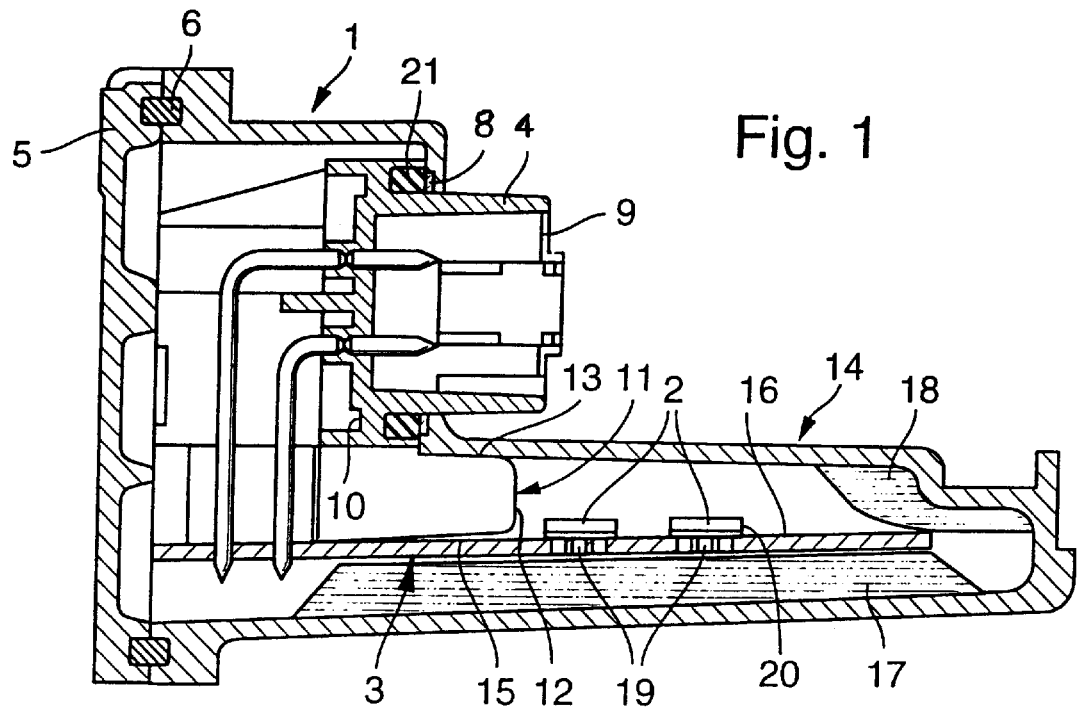
FIG. 1 is a schematic, lengthwise cross-sectional view through an electrical device with a wedge according to a first exemplary embodiment of the present invention.
Figure 2:
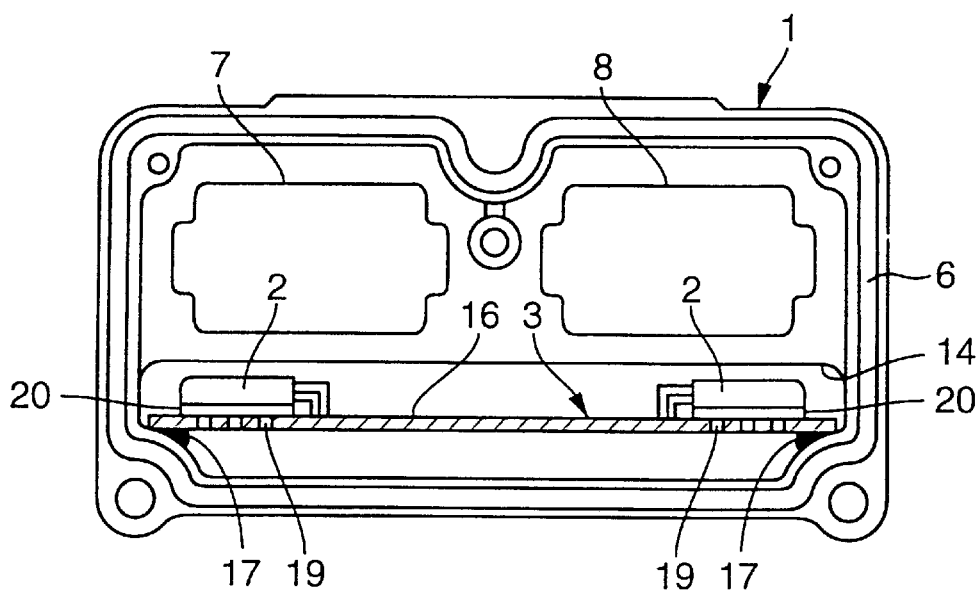
FIG. 2 is a schematic front view of the package according to the exemplary embodiment shown in FIG. 1.

The switching and control device according to the present invention, according to the first exemplary embodiment in FIGS. 1 and 2, has a package 1, a circuit board 3 arranged within package 1, equipped with components 2, and two plug-in connectors 4 soldered to circuit board 3. At its front, the package is closed with a lid 5 and a seal 6 arranged between lid 5 and package 1. The two plug-in connectors 4 pass through the package wall at the back of package 1, so that plug-in connectors 4 project out of package 1 through openings 7 and 8.

Plug-in connectors 4 have a plug-in connector element 9 with a plug-in connector base 10. A wedge 11 is arranged between plug-in connector element 9 and circuit board 3, projecting beyond plug-in connector base 10 in a direction parallel to a circuit board surface 16. Wedge 11 narrows conically towards its projecting end 12. With a top wedge side surface 13, wedge 11 rests against a rear top package wall, (bearing surface) 14 of package 1. With a bottom wedge side surface 15, wedge 11 rests against top circuit board surface 16. Below circuit board 3, i.e. on a side of circuit board 3 facing away from plug-in connector 4, the circuit board 3 rests against heat-conductive support surfaces 17 which are arranged laterally on package 1.

Top package wall 14 is arranged conically with reference to lateral support surfaces 17 and therefore also with reference to circuit board 3 which rests against them, in order to additionally reinforce the effect of the conical part pressing circuit board 3 against heat-conductive support surfaces 17, when circuit board is inserted into package 1. Another support surface 18 at a rear end of package 1 fixes circuit board 3 in place and also dissipates heat energy. The heat energy can be dissipated from support surfaces 17, 18 to the package 1, since the latter is made of metal.

Below components 2 arranged in the vicinity of support surfaces 17, multilayer circuit board 3 has feed-throughs 19, which are thermally connected (i.e. heat-conductively connected) both with a heat emission region 20 of components 2 and with an intermediate layer of circuit board 3.

A seal 21 is arranged on the circumference of plug-in connector element 9 and pressed against package 1 in the region of opening 8, forming a seal.

According to this exemplary embodiment of the present invention, circuit board 3 can be inserted from the front into slide-in package 1 when cover 5 is removed, and is pressed against heat-conductive support surfaces 17 during insertion, by wedge 11 which narrows conically in the slide-in direction. This is because wedge 11 rests against a top package wall 14 with its top wedge side surface 13 and presses circuit board 3 against support surfaces 17 with its bottom wedge side surface 15 with increasing force during insertion. Excess heat energy is passed on via heat emission region 20 of components 2, via feed-throughs 19, to an intermediate layer of circuit board 3, and from there, reliably to heat-conductive support surfaces 17, 18 and thereby to heat-conductive package 1, because of the close contact. The additional heat emission surface of support surfaces 17, 18, i.e. package 1 significantly improves cooling of components 2.

Figure 3:
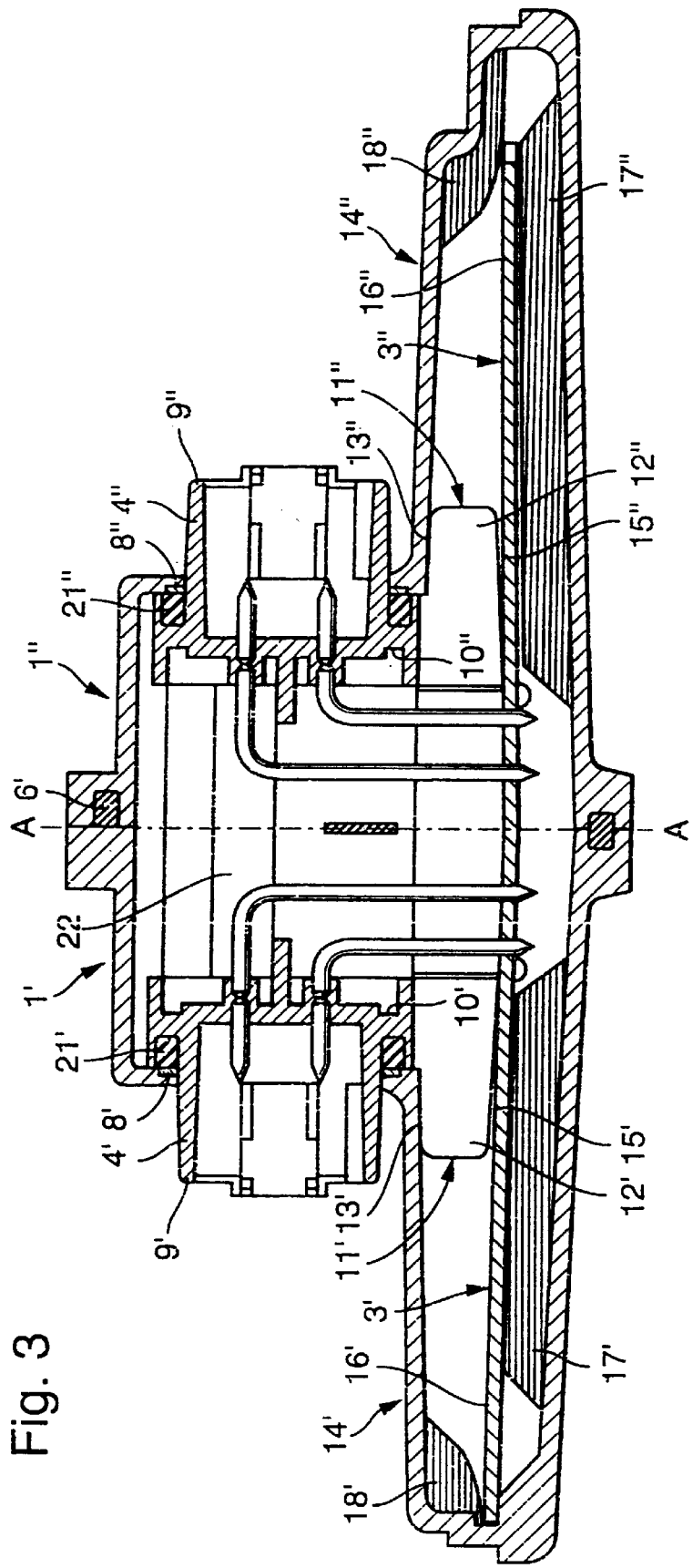
FIG. 3 is a schematic, lengthwise cross-sectional view through an electrical device with a wedge according to a second exemplary embodiment of the present invention.

FIG. 3 shows a second exemplary embodiment of the present invention. In this connection, two devices of the preceding exemplary embodiment are essentially combined, with axis symmetry relative to axis A—A. A plug-in connector 4', 4", in each instance, is soldered to a circuit board 3', 3". At the backs, two plug-in connectors 4', 4" are arranged at a distance from one another, with spacers 22, and oriented in opposite directions. Plug-in connectors 4', 4" are not rigidly connected with one another, but rather merely rest against one another and are pressed against the spacer, via seals 21', 21", when plug-in connectors 4', 4" are plugged into packages 1', 1". Alternatively, however, a rigid connection can also be provided between plug-in connectors 4', 4", and spacer 22. In this way, plug-in connectors 4', 4" form a rigid unit with circuit board 3', 3". Laterally to plug-in connectors 4', 4" is attached an elongated, one-part wedge 11' (and 11") having two conically narrowing ends 12', 12". The ends each engage between top package walls 14', 14", and circuit boards 3', 3". This makes it possible to press separate circuit boards 3', 3" against support surfaces 17', 17", so that the excess heat energy can be dissipated. Circuit boards 3', 3" can be connected with each other in rigid or flexible manner.

In an alternative embodiment, not shown, only one circuit board is arranged in packages 1', 1", instead of circuit boards 3', 3", with plug-in connectors 4', 4" being set on, oriented in opposite directions, above a circuit board surface, and not projecting beyond the circuit board parallel to the circuit board surface.

What is claimed is:
1. An electrical device having component heat dissipation, comprising:
a package including a plurality of heat-conducting support surfaces and a bearing surface;

a circuit board arranged inside the package, the circuit board resting on the plurality of support surfaces, the circuit board being fitted with at least one electrical component whose heat energy is at least partly dissipated onto the circuit board, and the circuit board including:

a circuit board surface, and a plug-in connector having a connecting part connected to the circuit board surface and a plug-in connector base arranged adjacent to the circuit board surface; and at least one wedge having a first wedge side which rests against the circuit board surface, the at least one wedge engaging the bearing surface to press the circuit board, against the plurality of support surfaces.

2. The device according to claim 1, the at least one wedge being arranged between the plug-in connector and the circuit board and projecting beyond the plug-in connector base in a direction parallel to the circuit board surface, the at least one wedge including a second wedge side which lies opposite the first wedge side, the second wedge side engaging the bearing surface.

3. The device according to claim 1, the circuit board surface, the connecting part, and the at least one wedge being inserted into the package via an openable face in the package, the circuit board surface being inserted along the plurality of support surfaces.

4. The device according to claim 3, the at least one wedge narrowing conically towards an inserted end.

5. The device according to claim 1, the at least one wedge including two wedges, the two wedges being arranged at opposite border regions of the circuit board parallel to a slide-in direction of the circuit board.

6. The device according to claim 1, each of the plurality of support surfaces being arranged conically with respect to the bearing surface.

7. The device according to claim 1, the bearing surface including a wall surface of the package located above the circuit board surface.

8. The device according to claim 7, the wall surface including a top wall of the package.

9. The device according to claim 1, the plug-in connector including first and second plug-in connectors arranged adjacent to one another, the first plug-in connector having a first base and the second plug-in connector having a second base, the at least one wedge being connected to each of the first and second plug-in connectors and projecting beyond the first and second bases, the at least one wedge being arranged parallel to a slide-in direction of the circuit board.

10. The device according to claim 9, the circuit board including first and second circuit boards arranged adjacent to one another, and the plurality of support surfaces including first and second sets of support surfaces, wherein the at least one wedge presses the first circuit board against the first set of support surfaces and presses the second circuit board against the second set of support surfaces.

11. The device according to claim 1, the at least one electrical component being arranged on the circuit board in a vicinity of the at least one wedge.

12. The device according to claim 11, the at least one electrical component being arranged in a vicinity of a lateral wall of the package.

13. The device according to claim 12, the at least one electrical component including a heat emission surface, the heat emission surface contacting the circuit board surface, and the circuit board surface including:

at least one feed-through disposed underneath the at least one electrical component;

a heat-conductive intermediate layer in thermal connection with the at least one feed-through; and a heat emission region which rests against the support surfaces.

* * * * *